(12) United States Patent
Pierobon et al.

(10) Patent No.: US 11,467,225 B2
(45) Date of Patent: Oct. 11, 2022

(54) METHOD OF DETERMINING AN ABSOLUTE ANGLE OF A MAGNETIC FIELD

(71) Applicant: EM Microelectronic-Marin SA, Marin (CH)

(72) Inventors: Lorenzo Pierobon, Neuchatel (CH); Alexandre Deschildre, Marin-Epagnier (CH); Evan Lojewski, Woodland Park, CO (US); Jeremy Schlachter, Gampelen (CH)

(73) Assignee: EM Microelectronic-Marin SA, Marin (CH)

( * ) Notice: Subject to any disclaimer, the term of this patent is extended or adjusted under 35 U.S.C. 154(b) by 831 days.

(21) Appl. No.: 16/296,581

(22) Filed: Mar. 8, 2019

(65) Prior Publication Data
US 2020/0284854 A1   Sep. 10, 2020

(51) Int. Cl.
*G01R 33/07* (2006.01)
*G01R 33/00* (2006.01)

(52) U.S. Cl.
CPC ......... *G01R 33/0023* (2013.01); *G01R 33/07* (2013.01); *G01R 33/0094* (2013.01)

(58) Field of Classification Search
CPC . G01R 33/0023; G01R 33/07; G01R 33/0094
See application file for complete search history.

(56) References Cited

U.S. PATENT DOCUMENTS

2007/0029998 A1* 2/2007 Popovic ............... G01R 33/077
324/247

2010/0118447 A1   5/2010 Hammerschmidt et al.
(Continued)

FOREIGN PATENT DOCUMENTS

CN    102906542 A    1/2013
CN    104048594 A    9/2014
(Continued)

OTHER PUBLICATIONS

Arbaugh, Jason, Todd, Table look-up CORDIC: effective rotations through angle partitioning, Dissertation, The University of Texas at Austin, Dec. 2004 (Year: 2004).*

(Continued)

*Primary Examiner* — Daniel R Miller
*Assistant Examiner* — Christian T Bryant
(74) *Attorney, Agent, or Firm* — Oblon, McClelland, Maier & Neustadt, L.L.P.

(57) ABSTRACT

A method of determining an absolute angle of a magnetic field includes receiving a first digital measurement value Bx of a first magnetic field component indicating intensity of the magnetic field along a first axis; receiving a second digital measurement value Bz of a second magnetic field component indicating the intensity of the magnetic field along a second axis, orthogonal to the first axis; determining absolute values for the first and second magnetic field components; and determining the angle of the magnetic field with respect to the first or second axis. The angle is determined so that the angle is derivable from the value of arcsin of Bz or of its approximation, when the absolute value of Bz≤ the absolute value of Bx, and derivable from the value of arccos of Bx or of its approximation, when the absolute value of Bz> the absolute value of Bx.

15 Claims, 2 Drawing Sheets

(56) References Cited

U.S. PATENT DOCUMENTS

| | | |
|---|---|---|
| 2011/0061962 A1 | 3/2011 | Sy et al. |
| 2013/0027028 A1 | 1/2013 | Hohe et al. |
| 2014/0197822 A1 | 7/2014 | Ritter et al. |
| 2014/0239942 A1 | 8/2014 | Schaaf |
| 2016/0123770 A1 | 5/2016 | Feucht et al. |
| 2017/0276516 A1 | 9/2017 | Werth et al. |

FOREIGN PATENT DOCUMENTS

| | | |
|---|---|---|
| CN | 107229020 A | 10/2017 |
| DE | 10 2010 003 292 A1 | 9/2011 |
| DE | 10 2011 115 302 A1 | 4/2013 |
| DE | 10 2013 000 431 A1 | 7/2014 |
| DE | 10 2017 204 623 A1 | 9/2017 |
| EP | 0 704 678 A1 | 4/1996 |
| EP | 1 465 346 A1 | 10/2004 |
| JP | 62-162917 A | 7/1987 |
| JP | 8-145719 A | 6/1996 |
| JP | 2000-39335 A | 2/2000 |
| JP | 2001-264114 A | 9/2001 |
| JP | 2004-301806 A | 10/2004 |
| JP | 2006-338526 A | 12/2006 |
| JP | 2011-99845 A | 5/2011 |
| JP | 2015-78863 A | 4/2015 |

OTHER PUBLICATIONS

Korean Office Action dated Feb. 19, 2021 in Korean Patent Application No. 10-2020-0023871 (with English translation), 25 pages.
European Search Report dated Aug. 1, 2019 in European Patent Application No. 19 16 1695.2, 7 pages.
Japanese Office Action dated Feb. 9, 2021 in Japanese Patent Application No. 2020-019397 (with English translation), 16 pages.
Japanese Office Action dated Jun. 22, 2021 in Japanese Patent Application No. 2020-019397 (with English translation), 14 pages.
Combined Taiwanese Office Action and Search Report dated Feb. 25, 2021 in Patent Application No. 109103673 (submitting English language translation only), 13 pages.
Office Action dated Jan. 11, 2022 in corresponding Japanese Patent Application No. 2020-019397 (with English Translation), 8 pages.

* cited by examiner

METHOD OF DETERMINING AN ABSOLUTE ANGLE OF A MAGNETIC FIELD

TECHNICAL FIELD

The present invention relates to a method of determining an absolute angle of a magnetic field. The invention also relates to a digital signal processor for carrying out the method.

BACKGROUND OF THE INVENTION

A typical system for detecting an angle of a magnetic field uses at least two magnetic sensors to detect two orthogonal components Bx and Bz of the magnetic field. The analogue magnetic field signals are converted in an analogue-to-digital converter (ADC) into digital signals (samples) before digital processing in a microcontroller. The microcontroller typically uses a formula arctan(Bx/Bz) for calculating the angle. However, using the arctan equation is problematic as the signals of Bx and Bz involve measurement errors, which have a strong effect on the resulting angle. To mitigate this problem, the signals Bx and Bz have to be encoded in high number of bits, which is also not optimal. This would also mean that the ADC would require a long conversion time or complex implementation. Furthermore, implementing the arctan computation is complex.

SUMMARY OF THE INVENTION

An object of the present invention is to overcome at least some of the above shortcomings of the existing solutions of determining the angle of a magnetic field.

According to a first aspect of the invention, there is provided a method of determining an absolute angle of a magnetic field, the method comprising the following steps carried out by a digital signal processor:
 receiving a first digital measurement value of a first magnetic field component, referred to as Bx, indicating intensity of the magnetic field along a first axis,
 receiving a second digital measurement value of a second magnetic field component, referred to as Bz, indicating intensity of the magnetic field along a second axis, orthogonal to the first axis,
 determining absolute values for the first and second magnetic field components, and
 determining the angle of the magnetic field with respect to the first or second axis, wherein the angle is determined so that the angle is derivable from the value of arcsin of Bz or of its approximation, when the absolute value of Bz≤ the absolute value of Bx, and derivable from the value of arccos of Bx or of its approximation, when the absolute value of Bz> the absolute value of Bx.

The proposed solution has the advantage that it minimises the impact of measurement errors contained in the samples on the final angle by avoiding a division of Bx/Bz (propagation of measurement errors). The present invention also reduces the number of bits required to encode the magnetic field components Bx and Bz. In many existing solutions, the magnetic field components Bx and Bz must be represented with enough bits to cover the values for 0 to 359 degrees. In the present invention, it is possible to consider the magnetic field components Bx and Bz only for limited intervals of degrees. The number of bits needed to encode the samples Bx and Bz (precision) may thus be reduced compared to existing angle determination solutions. This reduces the digital signal processor (DSP) parallelism or computational needs. Moreover, if the entire system in which the DSP is instantiated is considered, it leads to a relaxation of the requirement for the ADC in terms of complexity and/or conversion time. The use of the samples that have the smaller absolute value reduces further the impact of the measurement errors (trigonometrical reasons).

Furthermore, if the present invention uses one or more lookup tables (LUTs) for the angle determination, then the proposed solution simplifies the computations needed for the angle determination. It is to be noted that most of the existing solutions rely on the complex implementation of the arctan function. In other words, the existing solutions require a lot of on-chip area and greater power consumption. Instead, the proposed solution leads to reduced power consumption and area needed on chip by exploiting the optional lookup tables instead of implementing arcsin or arccos arithmetic blocks. The LUT based solution may have a relatively small number of entries in the table: depending on the application, at most 90 entries or more, even though often 45 are enough. This reduces further the occupied area on chip and reduces the time to perform the search in the LUT(s).

According to a second aspect of the invention, there is provided a digital signal processor for determining an absolute angle of a magnetic field, the digital signal processor comprising means for:
 receiving a first digital measurement value of a first magnetic field component, referred to as Bx, indicating intensity of the magnetic field along a first axis,
 receiving a second digital measurement value of a second magnetic field component, referred to as Bz, indicating intensity of the magnetic field along a second axis, orthogonal to the first axis,
 determining absolute values for the first and second magnetic field components, and
 determining the angle of the magnetic field with respect to the first or second axis, wherein the angle is arranged to be determined so that the angle is derivable from the value of arcsin of Bz or of its approximation, when the absolute value of Bz≤ the absolute value of Bx, and derivable from the value of arccos of Bx or of its approximation, when the absolute value of Bz> the absolute value of Bx.

According to a third aspect of the invention, there is provided a system comprising the digital signal processor and further comprising a first magnetic sensor for measuring the first magnetic field component, a second magnetic sensor for measuring the second magnetic field component, and an analogue-to-digital converter for converting analogue measurements signals of the first and second magnetic sensors to the first and second digital measurement values.

Other aspects of the invention are recited in the dependent claims attached hereto.

BRIEF DESCRIPTION OF THE DRAWINGS

Other features and advantages of the invention will become apparent from the following description of a non-limiting example embodiment, with reference to the appended drawings, in which.

DETAILED DESCRIPTION OF THE INVENTION

Figure 1:
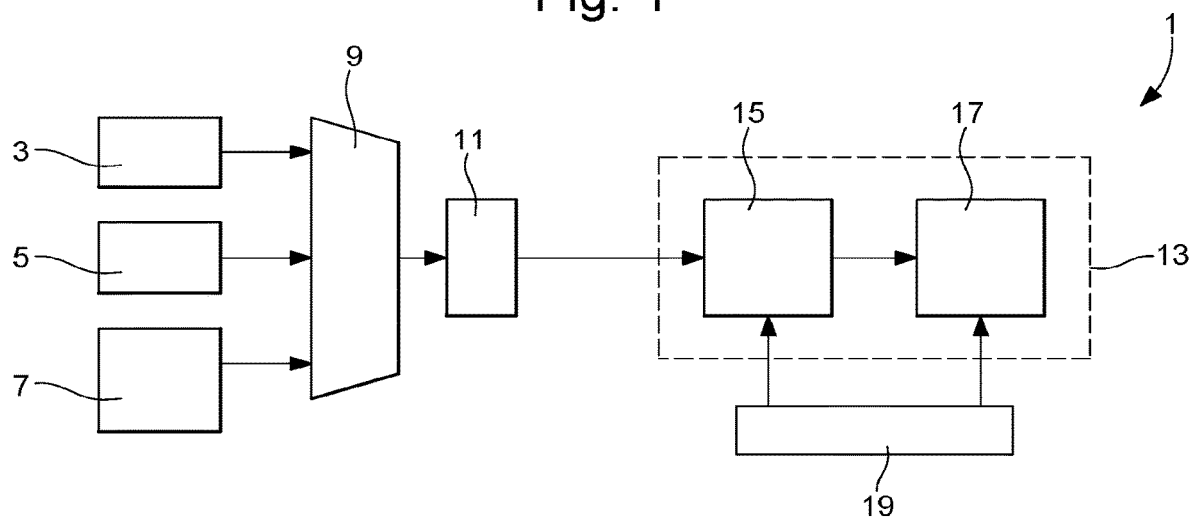
FIG. 1 shows a simplified block diagram illustrating an example system where the teaching of the present invention may be applied according to an example embodiment of the present invention.

An embodiment of the present invention will now be described in detail with reference to the attached figures. The invention will be described in the context of an angular detection of a magnetic field generated by a magnetic element of a rotating object, such as a wheel of a mouse for a computer. However, the teachings of the invention are not limited to this environment or application. For example, the teachings of the present invention may be also used in digital compasses among other applications. Identical or corresponding functional and structural elements which appear in different drawings are assigned the same reference numerals. As utilised herein, "and/or" means any one or more of the items in the list joined by "and/or". As an example, "x and/or y" means any element of the three-element set {(x), (y), (x, y)}. In other words, "x and/or y" means "one or both of x and y." As another example, "x, y, and/or z" means any element of the seven-element set {(x), (y), (z), (x, y), (x, z), (y, z), (x, y, z)}. In other words, "x, y and/or z" means "one or more of x, y, and z." Furthermore, the term "comprise" is used herein as an open-ended term. This means that the object encompasses all the elements listed, but may also include additional, unnamed elements. Thus, the word "comprise" is interpreted by the broader meaning "include", "contain" or "comprehend".

The block diagram of FIG. 1 schematically illustrates a circuit or system 1 for determining an absolute angle of a magnetic field according to an example of the present invention. The system comprises two magnetic field detecting sensors, i.e. a first sensor 3 and a second sensor 5. In this example, these sensors are Hall effect sensors, which are devices that are used to measure the magnitude or intensity of a magnetic field. The output voltage or current of a Hall sensor is directly proportional to the magnetic field strength through it. In the present description, a magnetic field is a vector field that describes the magnetic influence of electrical currents and magnetised materials. The term "magnetic field" is sometimes used for two distinct but closely related fields denoted by the symbols B and H. H is measured in units of amperes per meter while B is measured in teslas, which are equivalent to newtons per meter per ampere. H and B differ in how they account for magnetisation. In a vacuum, B and H are the same apart from units, but in a magnetised material, they differ by the magnetisation M of the material. In the following description, the magnetic field is expressed as B but H could be used interchangeably. The first Hall sensor 3 is arranged to determine the intensity of a first magnetic field component Bx along a first axis X while the second Hall sensor 5 is arranged to determine the intensity of a second magnetic field component Bz along a second axis Z, which in this example is orthogonal to the first axis. A temperature sensor 7 is provided in order to measure the temperature. It is to be noted that the behaviour of the Hall sensors depends on the temperature at which they operate. It is to be noted that the system may comprises further Hall sensors, such as a third Hall sensor for measuring a third magnetic field component By along a third axis Y, which may be orthogonal to the first and second axes. In this case, all the three Hall sensors may or may not be in the same plane.

The system in this example also comprises a multiplexer 9 to receive at its input the analogue outputs of the sensors 3, 5, 7. The multiplexer is arranged to select one analogue input at a time and forward them (one at a time in this example) into a single output line, which is connected to an ADC unit 11. The ADC unit is arranged to convert the analogue measurement signals into digital signals or values. It is to be noted that instead of the system 1 comprising the multiplexer 11, the system could comprise a dedicated ADC for each sensor.

The digital measurement signals are then arranged to be fed into a digital signal processor (DSP) 13. In this simplified illustration, as far as the teachings of the present invention are concerned, the DSP comprises two main units or blocks, namely a compensation unit 15 for compensating the magnetic field offset, temperature and/or distortion, and an angle determination unit 17 for computing or determining the angle of the magnetic field. The system further comprises a memory unit 19, which is connected to the compensation unit 15 and to the angle determination unit 17 such that these units are arranged to access the memory. The memory unit in this example comprises a non-volatile memory. The main operations of the compensation unit 15 of the DSP are:

Eliminate offset due to the fabrication of the Hall sensors and impact of the temperature; and Remove distortions due to the presence of parasitic fields generated by a circuit board that hosts the DSP and the sensors.

It is to be noted that without the offset elimination step, the magnetic field components Bx and Bz when drawn in a cartesian coordinate system would typically show an ellipse whose centre would be located offset with respect to the origin (having coordinates (0, 0)) of the coordinate system. By applying temperature compensation, hard iron compensation and re-calibration, the ellipse can typically be brought to the centre of the coordinate system. If soft iron compensation is now applied, the ellipse could be converted into a circle centred at the origin of the coordinate system. Once a circle centred at the origin is obtained, the angle determination may be started as explained later in more detail.

Figure 2:
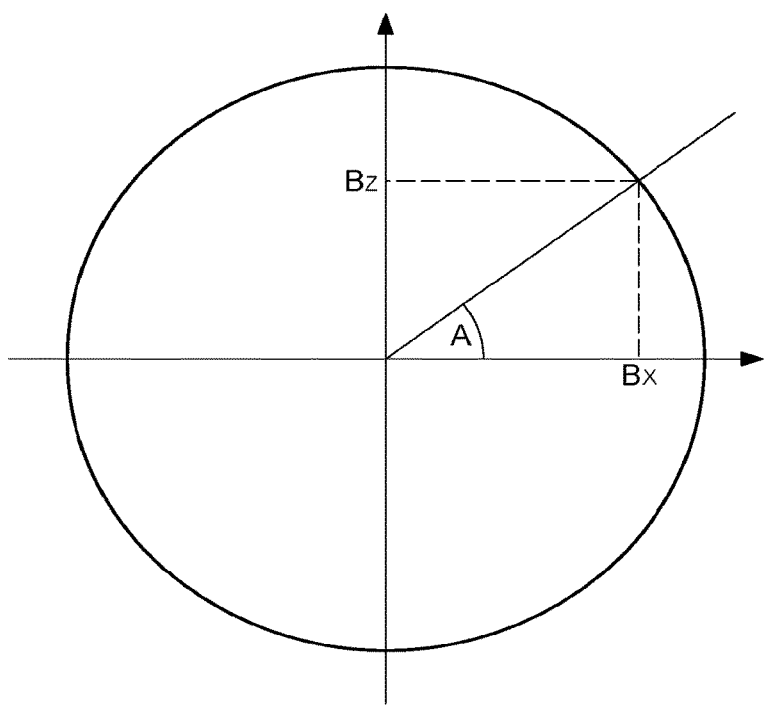
FIG. 2 shows a polar coordinate plot illustrating the relationship of the two magnetic field components during a full rotation of the magnetic field and their relationship to the angle of the magnetic field.

The present invention proposes a new method and DSP architecture optimised for angular detection of a magnetic field. The invention has been developed for the following application, for instance. A magnet is mounted inside a wheel that turns around its rotation axis (e.g. coinciding with a shaft around which the wheel rotates). Rotation of the wheel leads to the rotation of the magnet and thus a variation of the magnetic field. The magnetic field is monitored by the magnetic sensors 3, 5 mounted in a plane parallel to the wheel rotation axis. As mentioned above, one of the sensors measures the magnetic field along the X-axis (component Bx) while the other sensor measures the magnetic field along the Z-axis (component Bz). It is to be noted that Bx and Bz form a plane orthogonal to the wheel rotation axis. The field along the Y-axis (By) may be monitored as well. However, since the Y axis is parallel to rotation axis, the variations of the By due to the rotation of the wheel are minimal. In the following scenario, the angle calculation is based on Bx and Bz. For the sake of brevity, the component By is not considered in the following description. In the illustrated example embodiment, the input of the angle determination operation consists of the magnetic field components Bx and Bz, while the output is the angle "A" between the X-axis and the magnetic field as also shown in FIG. 2.

One of the objects of the invention is to minimise the precision of the inputs Bx and Bz while guaranteeing a 1-degree precision of the output angle. Both Bx and Bz are digital values encoded in a finite number of bits. Reducing their precision reduces the DSP parallelism. Furthermore, if the entire system in which the DSP is instantiated is considered, it leads to a relaxation of the requirement for the ADC in terms of complexity and/or conversion time. It will be shown how the present invention allows using 7-bit encoding for Bx and Bz, while the known solutions would require 14 bits each to reach a 1-degree precision for the calculated angle. More specifically, the formula A=arctan (Bz/Bx) as used in many of the existing solutions would require encoding Bx and Bz in 14 bits in order to represent all the values from 0 to 359 degrees. Moreover, the division itself causes the measurement error to propagate.

In the following description, when describing the invention in more detail, for the sake of simplicity, only the calculation of the angles between 0 and 90 degrees is considered first. However, it will be shown how the proposed approach can be extended to the entire range of 360 degrees. When Bz≤Bx (0°≤A≤45°), the angle is calculated in the following manner: A=arcsin(Bz). This equation is more advantageous than arctan because there is no division Bz/Bx. Furthermore, in the interval 0 to 45 degrees, Bz can be represented with 6 bits (instead of 13), while still maintaining a 1-degree precision. On the other hand, when Bz>Bx (45<A<90), the angle is calculated in the following manner: A=arccos(Bx). This equation has the same advantages as arcsin when compared to arctan. Again, in the interval 45 to 90 degrees, Bx can be represented with 6 bits only.

However, arcsin and arccos are rather complex functions to be implemented in hardware. Two steps have been found to simplify their implementations as explained next. According to a first step, the arccos computation can be derived from the arcsin computation. More specifically, arccos(Bx) =89−arcsin(Bx). This allows implementing the arcsin computation only and using a constant to transform the result into arccos.

The second step involves using one or more lookup tables for obtaining the value of the angle. More specifically, a first lookup table comprises different values for Bz for the angles between 0° and 45°. Each entry in the lookup table is also associated with its arcsin value, i.e. arcsin(Bz). In other words, the first lookup table may be understood to comprise N lines of data such that each line comprises a different Bz value. Each line is then identified by the arcsin value of Bz stored at the respective line. The different arcsin(Bz) values form thus line identifiers or storage location identifiers in the first lookup table. If the table covers angles 0° to 45° and 1-degree precision is desired, then the first lookup table includes 46 lines. More generally, the number N of the values Bz in the first lookup equals (1+45)/(angle precision in degrees).

The first lookup table is used in the following manner. First, the absolute values for Bx and Bz are determined. The component with the smaller absolute value is then chosen and the smaller absolute value is then used to carry out a search in the first lookup table. If not already done, then at this moment the signs of the components Bx and Bz are saved, e.g. in the memory 19 or in another location. The search in the first lookup table may involve finding the value closest to the absolute value of the incoming Bx or Bz (the one with the smaller absolute value is used in the search).

Once the searched value has been found, the line identifier of the found value in the table gives an angle A'. The angle A can then be derived from the angle A' as explained below. The search in the first lookup table can be performed in log 2 (number of rows) operations. In the case, where 1-degree precision is required, the first lookup table is formed by 46 rows, each of them containing the corresponding value of arcsin represented with 6-bits in this example. The lookup operation consists of log 2(46)=6 comparisons.

Regarding the first lookup operation, the below procedure may be used to find A' in the first lookup table. The following definitions are given first:

The "Selected field component" equals abs(Bz) when abs(Bz)≤abs(Bx), otherwise it equals abs(Bx).

The line identifiers or numbers of the first lookup table start from 0.

LUT(selected_line) means the value stored in the first lookup table at the line=selected_line.

LUT(selected_line−1) means the value stored in the first lookup table at the line before the line the process is selecting.

In view of the above definitions, the following procedure is carried out. If the selected magnetic field component (Bx or Bz) is smaller or equal to LUT(selected_line) and greater than LUT(selected_line−1), then the angle A' has been found. The angle A' is equal to selected_line. Otherwise, another line is selected and the check repeated. In order to determine the next line to be selected, a binary search algorithm may be used. This algorithm guarantees to find A' with log 2 (number of rows) comparisons.

The above procedure can then be extended to cover all the cases for the angle A in the range of 0 to 359 degrees. This can be implemented by using a second lookup table as shown in Table 1 below.

TABLE 1 second lookup table

| Sign Bz | Sign Bx | Min(abs(Bx), abs(Bz)) | A |
|---|---|---|---|
| + | + | Z | A' |
| + | + | X | 89 − A' |
| + | − | X | 90 + A' |
| + | − | Z | 179 − A' |
| − | − | Z | 180 + A' |
| − | − | X | 269 − A' |
| − | + | X | 270 + A' |
| − | + | Z | 359 − A' |

The second lookup table specifies which mathematical operation if any has to be carried out to obtain the desired angle A. To determine which mathematical operation is required, the signs of the magnetic field components Bx and Bz have to be known as well as which one of the magnetic field components has the smallest absolute value. Based on these pieces of information, the second lookup table is able to specify the specific mathematical operation needed to obtain the angle A. If a mathematical operation is needed, then it involves either adding or subtracting A' from a given angle value (constant value). Thus, depending on the values of the magnetic field components Bx and Bz, the angle A calculation is based on A'=arcsin(Bz) if the absolute value of Bz is smaller than or equal to the absolute value of Bx. This is the case when the angle A is between 0° and 45°, between 135° and 180°, between 180° and 225°, or between 315° and 360°. Inversely, if the absolute value of Bz is greater than the absolute value of Bx, then the angle A calculation is based on A'=arccos(Bx). This is the case when the angle A is between 45° and 90°, between 90° and 135°, between 225° and 270°, or between 270° and 315°. The transforming operation from the angle A' to the angle A is merely converting the angle from the first octant (0° to 45°) to the correct octant by adding or subtracting constant values. This is implemented in two steps. The first step involves the octant detection. This step includes considering the signs of Bx and Bz and their absolute values. The second step involves an angle adjustment operation, i.e. implementing the operation defined in the fourth and last column of the second lookup table. This operation includes adding or subtracting constants. By exploiting the first and second lookup tables also means that power and area on chip can be decreased even more compared to a solution which does not use any lookup tables. Furthermore, this also means that there is no need to implement any arcsin or arccos arithmetic blocks. It is also to be noted that the first and second lookup tables could be combined into a single lookup table instead of having two separate lookup tables.

Figure 3:
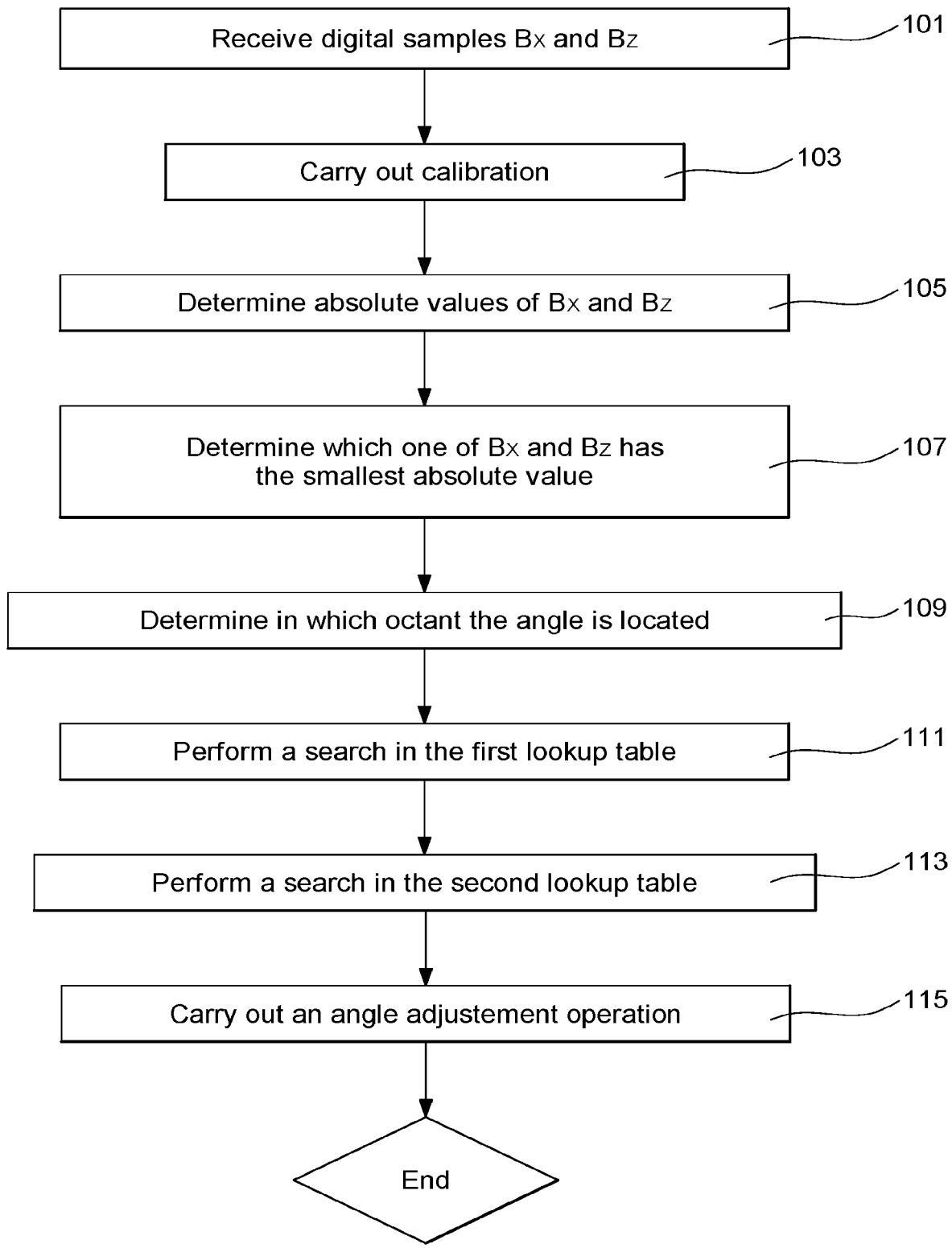
FIG. 3 shows a flow chart summarising the method steps of the proposed angle determination process according to an example embodiment of the present invention.

The invention is next summarised with reference to the flow chart of FIG. 3. In step 101, the DSP receives the digital samples of the magnetic field components Bx and Bz. In step 103, a calibration operation is performed on the samples in order to remove effects due to temperature variations and due to parasitic magnetic fields before the angle is determined. In step 105, the DSP determines the absolute values of the magnetic field components Bx and Bz. In step 107, the DSP determines which one of the magnetic field components Bx and Bz has the smallest absolute value. In step 109, the DSP uses the determinations of steps 105 and 107 to determine in which octant the magnetic field angle is located. In step 111, the DSP carries out a search in the first lookup table in order to determine the angle A. In step 113, the DSP carries out a search in the second lookup table in order to determine which mathematical operation is needed to transform the angle A' to the desired angle A. In step 115, the mathematical operation defined in the second lookup table is carried out to obtain the angle A. The process then comes to end or starts again for a new set of magnetic field components received from the ADC 11.

It is to be noted that in the above embodiment, the magnetic field was measured with respect to the X-axis. However, according to a variant of the present invention, it would be possible to measure the magnetic field with respect to the Z-axis instead. In this case the principle as explained above would remain the same. However, in this variant of the invention, the first lookup table would contain values for Bx between the angles 0° and 45° and the line identifiers would be arcsin(Bx) instead of arcsin(Bz). Furthermore, the second lookup table would also be different as shown below.

TABLE 2 a variant of the second lookup table

| Sign Bz | Sign Bx | Min(abs(Bx), abs(Bz)) | A |
|---|---|---|---|
| + | + | X | A' |
| + | + | Z | 89 − A' |
| − | + | Z | 90 + A' |
| − | + | X | 179 − A' |
| − | − | X | 180 + A' |
| − | − | Z | 269 − A' |
| + | − | Z | 270 + A' |
| + | − | X | 359 − A' |

In a further variant of the invention, the system would contain at least three magnetic sensors. In this case, the three or more magnetic sensors would measure two magnetic components only (i.e. only two of the magnetic sensors would be operative at a time).

To summarise the above teachings, the invention concerns a new solution for detecting an absolute (as opposed to a relative angle between two angle measurements) angle of a magnetic field by a DSP architecture in an optimised manner. The system includes at least two magnetic sensors, for example Hall sensors, linked at two inputs of an ADC unit through an optional controlled multiplexer. A DSP receives the digital samples Bx and Bz and determines the angle of the magnetic field. The two digital samples Bx and Bz are advantageously represented with small number of bits. Once the DSP has determined the angle, it provides the angle at its output. The DSP unit acts on the digital samples after an operation of calibration in order to remove effects due to temperature variations and due to parasitic magnetic fields before the angle is determined.

While the invention has been illustrated and described in detail in the drawings and foregoing description, such illustration and description are to be considered illustrative or exemplary and not restrictive, the invention being not limited to the disclosed embodiment. Other embodiments and variants are understood, and can be achieved by those skilled in the art when carrying out the claimed invention, based on a study of the drawings, the disclosure and the appended claims.

In the claims, the word "comprising" does not exclude other elements or steps, and the indefinite article "a" or "an" does not exclude a plurality. The mere fact that different features are recited in mutually different dependent claims does not indicate that a combination of these features cannot be advantageously used. Any reference signs in the claims should not be construed as limiting the scope of the invention.

What is claimed is:

1. A method of determining an absolute angle of a magnetic field from a magnetic field sensor, the method comprising the following steps carried out by a digital signal processor:

receiving a first digital measurement value of a first magnetic field sensor (Bx), indicating intensity of the magnetic field along a first axis, receiving a second digital measurement value of a second magnetic field sensor (Bz), indicating intensity of the magnetic field along a second axis, orthogonal to the first axis, determining absolute values for the first and second magnetic field sensors, and determining, using a digital signal processor, the angle of the magnetic field with respect to the first or second axis, wherein the angle is derivable by the digital signal processor from the value of arcsin of Bz or of its approximation, where Bz is 1 or less, when the absolute value of Bz<the absolute value of Bx, and derivable from the value of arccos of Bx or of its approximation, wherein Bx is 1 or less, when the absolute value of Bz>the absolute value of Bx.

2. The method according to claim 1, wherein determining the angle of the magnetic field comprises fetching the value of arcsin of Bz or of its approximation or arcsin of Bx or of its approximation from a first lookup table.

3. The method according to claim 2, wherein the first lookup table comprises different values of Bz, such that each value of Bz in the first lookup table is identified by the value of its arcsin if the angle is determined with respect to the first axis, or different values of Bx, such that each value of Bx in the first lookup table is identified by the value of its arcsin if the angle is determined with respect to the second axis.

4. The method according to claim 3, wherein the first lookup table comprises different values of Bz or Bx for the angles from 0° to 45°.

5. The method according to claim 4, wherein a number N of the values Bz or Bx in the first lookup equals (1+45)/(angle precision in degrees).

6. The method according to claim 2, wherein the method further comprises:
determining which one of the absolute values of the magnetic field sensors Bz and Bx is smaller,
selecting the magnetic field sensor with the smaller absolute value,
accessing the first lookup table by using the selected magnetic field sensor, and
selecting the value Bz or Bx from the first lookup table corresponding to the selected magnetic field sensor.

7. The method according to claim 6, wherein the selected value Bz or Bx in the first lookup table corresponds to the selected magnetic field sensor if the selected magnetic field sensor is smaller or equal to the selected value of Bz or Bx and greater than the value of Bz or Bx in the preceding memory location in the first lookup table.

8. The method according to claim 1, wherein the angle is determined by performing a given mathematical operation involving subtracting the obtained value of arcsin from a given angle value or adding the obtained value of arcsin to the given angle value.

9. The method according to claim 8, wherein the method further comprises:
determining which one of the absolute values of the magnetic field sensors Bx and Bz is smaller,
determining signs of Bx and Bz, and
accessing a second lookup table for fetching the given mathematical operation from the second lookup table based on the signs of Bx and Bz and based on which one of the absolute values of the magnetic field sensors Bx and Bz is smaller.

10. The method according to claim 1, wherein the method further comprises compensating the first and second digital measurement values before the angle determination in order to remove effects due to temperature variations and due to parasitic magnetic fields.

11. A system comprising:
a digital signal processor configured to determine an absolute angle of a magnetic field, the digital signal processor being further configured to:
receive a first digital measurement value of a first magnetic field sensor, referred to as Bx, indicating intensity of the magnetic field along a first axis,
receive a second digital measurement value of a second magnetic field sensor, referred to as Bz, indicating intensity of the magnetic field along a second axis, orthogonal to the first axis,
determine absolute values for the first and second magnetic field sensors, and
determine the angle of the magnetic field with respect to the first or second axis, wherein the angle is derivable by the digital signal processor from the value of arcsin of Bz or of its approximation, wherein Bz is 1 or less, when the absolute value of Bz≤the absolute value of Bx, and derivable from the value of arccos of Bx or of its approximation, wherein Bx is 1 or less, when the absolute value of Bz >the absolute value of Bx.

12. The system comprising the digital signal processor according to claim 11, and further comprising a first magnetic sensor for measuring the first magnetic field sensor, a second magnetic sensor for measuring the second magnetic field sensor, and an analogue-to-digital converter for converting analogue measurements signals of the first and second magnetic sensors to the first and second digital measurement values.

13. The system according to claim 12, wherein the magnetic sensors are Hall effect sensors.

14. The system according to claim 12, wherein the system further comprises a third magnetic sensor for measuring a third magnetic field sensor, referred to as By, indicating the intensity of the magnetic field along a third axis, which is orthogonal to the first and second axes.

15. The system according to claim 14, wherein only two of the magnetic sensors are operative at a time.

* * * * *